United States Patent [19]
Mason

[11] Patent Number: 5,369,621
[45] Date of Patent: Nov. 29, 1994

[54] DOMINO STYLE ADDRESS PREDECODER

[75] Inventor: Russell W. Mason, Ft. Collins, Colo.

[73] Assignee: Hewlett-Packard Company, Palo Alto, Calif.

[21] Appl. No.: 935,952

[22] Filed: Aug. 26, 1992

[51] Int. Cl.⁵ .................................. G11C 7/00
[52] U.S. Cl. .................... 365/230.06; 365/189.04; 365/191; 326/106
[58] Field of Search .............. 365/189.04, 189.07, 365/191, 230.06; 307/449, 452, 480, 481

[56] References Cited

U.S. PATENT DOCUMENTS 4,852,061 7/1989 Baron et al. .............. 365/230.06 X
4,998,221 3/1991 Correale, Jr. ................ 365/189.07

OTHER PUBLICATIONS

DeLano et al., "A High Speed Superscalar PA-RISC Processor", Proceedings of the Compcon Spring 1992, Digest of Papers, San Francisco, CA, Feb. 24–28, 1992.

Primary Examiner—Joseph A. Popek

[57] ABSTRACT

An address decoder having a predecoder which predecodes n pairs of true/complement address inputs into 2n memory select lines. By predecoding the address inputs in this manner, the number of pull-down FETs in the pull-down string of the NAND decoder may be minimized so as to provide area and speed advantages. Predecode is provided in a preferred embodiment by logically ANDing the respective true/complement addresses in address pairs to provide a unique predecode value to the decoder. In order to minimize the number of input lines, a decoder only receives inputs over the predecode lines having predecoded addresses unique to that decoder.

4 Claims, 5 Drawing Sheets

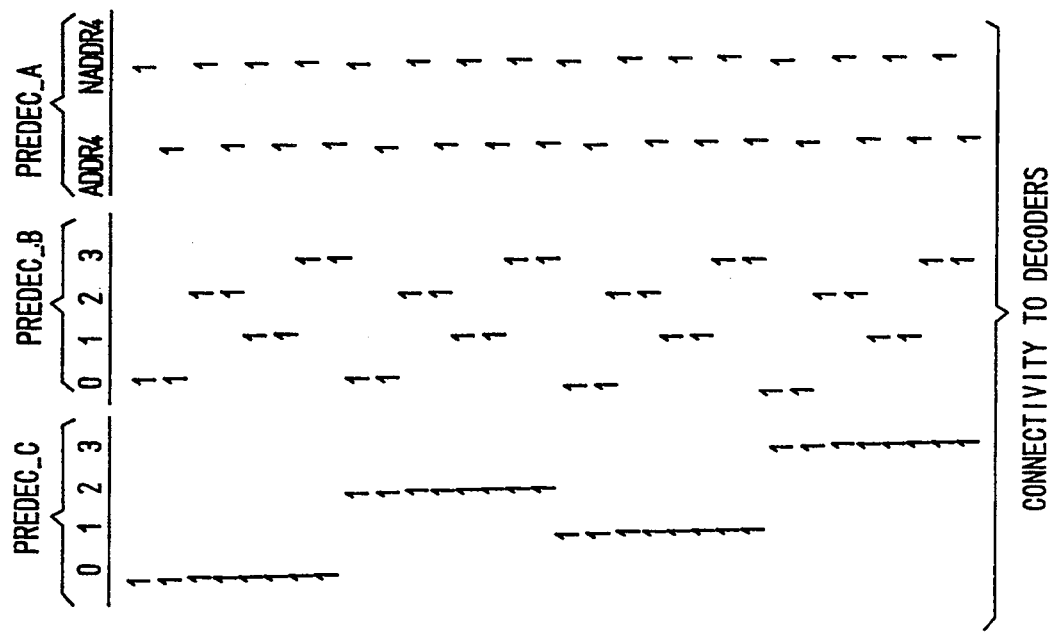
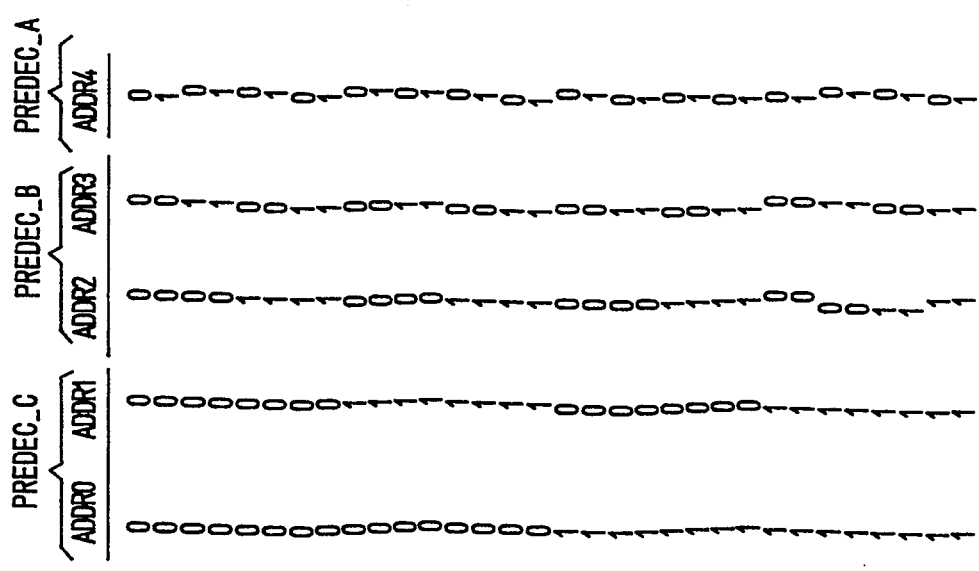
FIG 4

DOMINO STYLE ADDRESS PREDECODER

BACKGROUND OF THE INVENTION

1. Field of the Invention

The present invention relates to a predecoder for decoding the address of a memory register in a register file, and more particularly, to a predecoder for converting n pairs of true/complement address inputs into 2n memory select lines for selecting banks of memory registers of the register file while also minimizing the number of required pull-down FETs in the decoder.

2. Description of the Prior Art

Recently, floating point processors have been designed which allow concurrent execution of a floating point multiply, divide, add and load or store instructions, thereby significantly increasing the processing efficiency of a floating point processor. For example, DeLano et al. describe in an article entitled "A High Speed Superscalar PA-RISC Processor", *Proceedings of the Compcon Spring 1992, Digest of Papers*, San Francisco, Calif., Feb. 24–28, 1992, a central processing unit comprising an integer processor and a floating point coprocessor which achieves exceptional performance and structural density. The floating point coprocessor consists of a register file, a floating point ALU, a floating point multiplier, and a floating point divide/square root unit and is integrated onto the same chip as the integer processor. The speed and density characteristics of such a circuit was exploited by implementing a system of dynamic, self-timed logic.

Self-timed logic or so-called "mousetrap" logic is distinguished by the generation of glitch free signals of the type described by Yetter in U.S. patent application Ser. No. 07/684,720, filed Apr. 12, 1991, now U.S. Pat. No. 5,208,490 and assigned to the same Assignee as the present invention. As described by Yetter in that patent application, "mousetrap" style logic circuits are timed by transitions in the data itself rather than clock edges. Such a self-timed system implements logic paths for encoding respective "vector logic states" which are specified by collectively conceptualizing the individual logic states or "vector components" on the logic paths. In particular, an "invalid" vector logic state is defined as the case when all vector components are at a logic low (a logic "0" or low electrical signal level). On the other hand, each of the "valid" vector logic states is specified via a variety of schemes such as one in which one and only one of the vector components of a vector logic state exhibits a logic high (a logic "1" or high electrical signal level). Encoding of the vector logic states can then be handled by defining a valid vector logic state by more than one logic path while still defining an invalid vector logic state when all logic paths exhibit a low logic level.

The present inventor set out to build a register file for a system of the type described by Delano et al. for use in a floating point data path comprised of logic circuits requiring a periodic electrical pre-charge phase and an evaluate phase in order to maintain and properly perform the intended logic function. Since the register file of Delano et al. has thirty-two 64-bit registers (four registers are reserved for floating point exception data) and 5 read ports and 3 write ports to allow concurrent execution of a multiply, an add and a load or store, it was the goal of the present inventor to design a register file which maximizes speed while minimizing the area required for implementing the 32 registers in the register file and in particular the address decoders used for accessing the 32 registers in the register file.

In the register file of the type described by Delano et al., thirty-two 64-bit registers are provided, where each register has 8 ports (3 write and 5 read). There is thus a total of 32*8=256 address decoders in the register file, where each decoder selects 1 of 32 registers. As a result, 5 pairs of true/complement address lines are needed for each port to uniquely specify which of the registers is to be read from or written to. Generally, the decoder outputs are used to select a register for reading or for writing. A register is written during a first clock and read on a precharged bus during a second clock. Thus, during the first clock, a glitch-free register write enable must be provided by the write address decoders to the register file. Such a system for use in conjunction with floating point exception flags is described, for example, by Mason et al. in U.S. patent application Ser. No. 07/899,202, filed Jun. 16, 1992, now U.S. Pat. No. 5,257,214 and assigned to the same Assignee as the present invention. As described therein, if the write enable is allowed to glitch, the register contents can be disturbed. Likewise, during the second clock, glitch-free register read signals must be provided by the read decoders to the register file. As in the case of the write enable, if the read enable is allowed to glitch, the precharged register output can be disturbed. Domino-style logic has been used to provide such glitch-free operation.

As illustrated in FIG. 1, a known 5 input AND gate domino decoder 100 may be used to select 1 of the 32 registers based on 5 read port address inputs. As shown, 5 input AND gate decoder 100 consists of a PFET precharger 102 responsive to the input clock signal CK, 5 NFET transistors 104–112 in the NAND pull-down string, and an output inverter 114. The respective NFET transistors 104–112 receive 5 true/complement address pairs ADDR0–ADDR4 and NADDR0–NADDR4 as illustrated such that 10 wires must be routed through the decoder stack. Each address line is loaded by 16 of the 32 address decoders.

In the embodiment of FIG. 1, since no predecode is provided, the pull-down circuit has 5 NFETs 104–112, one for each true/complement address. Such long pull-down strings, in addition to having more transistors, also require more area for each transistor, for in order to have the same effective width/length ratio as a single pull-down transistor, each FET needs to be roughly five times wider than a single transistor. Hence, the decoder 100 illustrated in FIG. 1 takes up a relatively large amount of chip space. A smaller and faster decoder is desired.

The domino-style logic used in the embodiment of FIG. 1 also is not free from charge sharing problems, especially for long pull-down strings. During the precharge phase, nodes internal to the NAND pull-down string may not be precharged high because the inputs are low and hence the intermediate nodes are isolated. This can allow zero logic levels to be trapped on the intermediate nodes. Charge sharing can occur when the topmost transistors in the pull-down string turn on but the bottommost transistor is off. For long pull-down strings, internal nodes can be pre-charged to eliminate such charge sharing problems. However, the addition of these prechargers has obvious area disadvantages. It is thus desirable to shorten the pull-down string of the NAND decoder 100 so as to minimize the effects of charge sharing which would otherwise occur when domino-style logic is used.

Accordingly, an improved decoder for a register file is desired which can provide glitch-free read and write enables to the register file without the necessity of a long pull-down string of the type used in the prior art. The present invention has been designed to meet this need.

SUMMARY OF THE INVENTION

The above-mentioned need in the art has been met by implementing an address decoder using a domino-style logic AND gate which is precharged and then evaluated so as to provide glitch-free read and write enables to the register file. In such an implementation, during the precharge state the address inputs are held low. The decoder output is thus low. Then, by providing address inputs which make no more than one transition (from low to high), the output can also make no more than one transition (from low to high).

A domino style address predecoder in accordance with the invention decodes n pairs of true/complement address inputs into 2n memory bank select lines. For example, 2 pairs of true/complement address inputs may be decoded into 4 memory select lines so that there are 4 inputs to the predecoder and 4 outputs to the decoder. Hence, it is now possible in accordance with the invention to feed 8 memory select lines plus 1 pair of true/complement addresses into the decoder stack to address 32 registers so that only 3 pull-down FETs rather than 5 pull-down FETs are needed at each register port. Ten wires are still fed into the decoder stack as in the corresponding prior art device; however, the true/complement lines are no longer required for the memory select in accordance with the invention. Since the resulting NAND decoder has only 3 FETs in its pull-down string for addressing 32 register files, the predecoder of the invention provides significant area and speed advantages.

A preferred embodiment of the invention relates to an address decoder which provides a read signal or a write signal for reading/writing data from/to a particular memory register of a memory device having a plurality of memory registers. A decoder in accordance with the preferred embodiment preferably comprises means for providing an address of the particular memory register across a number of address lines in accordance with the number of memory registers of the memory device. In addition, a plurality of address decoders are provided for selecting the particular memory register of the memory device by providing a read or a write signal to the particular memory register when the address has been decoded. However, the invention is particularly characterized by a predecoder responsive to the number of address lines for decoding every n pairs of address lines into 2n memory select lines which are provided only to the address decoders corresponding to the memory registers unique to the n pairs of address lines.

Preferably, the address is provided to the predecoder via respective true/complement address pairs corresponding to each bit in the read or write address. For example, the predecoder may comprise a 4-to-4 decoder for every two pairs of true/complement addresses provided by the providing means across the address lines. Each 4-to-4 decoder of the predecoder then outputs a memory select signal which corresponds to a logical AND of the true/complement address lines unique to the particular memory register specified by the address.

In a preferred embodiment, each of the address decoders comprises n/2 pull-down FETs responsive to 2n memory select lines, where n is even, or (n+1)/2 pull-down FETs responsive to 2n memory select lines, where n is odd. The n/2 or (n+1)/2 pull-down FETs are preferably connected in series such that a read or write signal is provided to the particular memory register specified by the address only when each of the memory select lines is true for an address decoder corresponding to the specified address. Of course, other arrangements will become apparent to those skilled in the art.

BRIEF DESCRIPTION OF THE DRAWINGS

The objects and advantages of the invention will become more apparent and more readily appreciated from the following detailed description of the presently preferred exemplary embodiment of the invention taken in conjunction with the accompanying drawings, of which:

FIG. 4 illustrates the predecoding technique of the invention for a five bit address specifying 1 of 32 register files.

DETAILED DESCRIPTION OF THE PRESENTLY PREFERRED EXEMPLARY EMBODIMENT

The inventor of the subject matter disclosed and claimed herein has satisfied the above-mentioned need in the art by developing a predecoder which minimizes the number of address inputs without increasing the number of connections to a decoder which provides a glitch-free read or write signal. An address decoder including such a predecode function in accordance with a presently preferred exemplary embodiment of the invention will be described below with respect to FIGS. 2–5. However, it will be appreciated by those of ordinary skill in the art that the description given herein with respect to those figures is for exemplary purposes only and is not intended in any way to limit the scope of the invention. For example, the invention need not be limited to floating point processors and may include other types of addressing circuitry requiring decoders. Accordingly, all questions regarding the scope of the invention should be resolved by referring to the appended claims.

Figure 1:
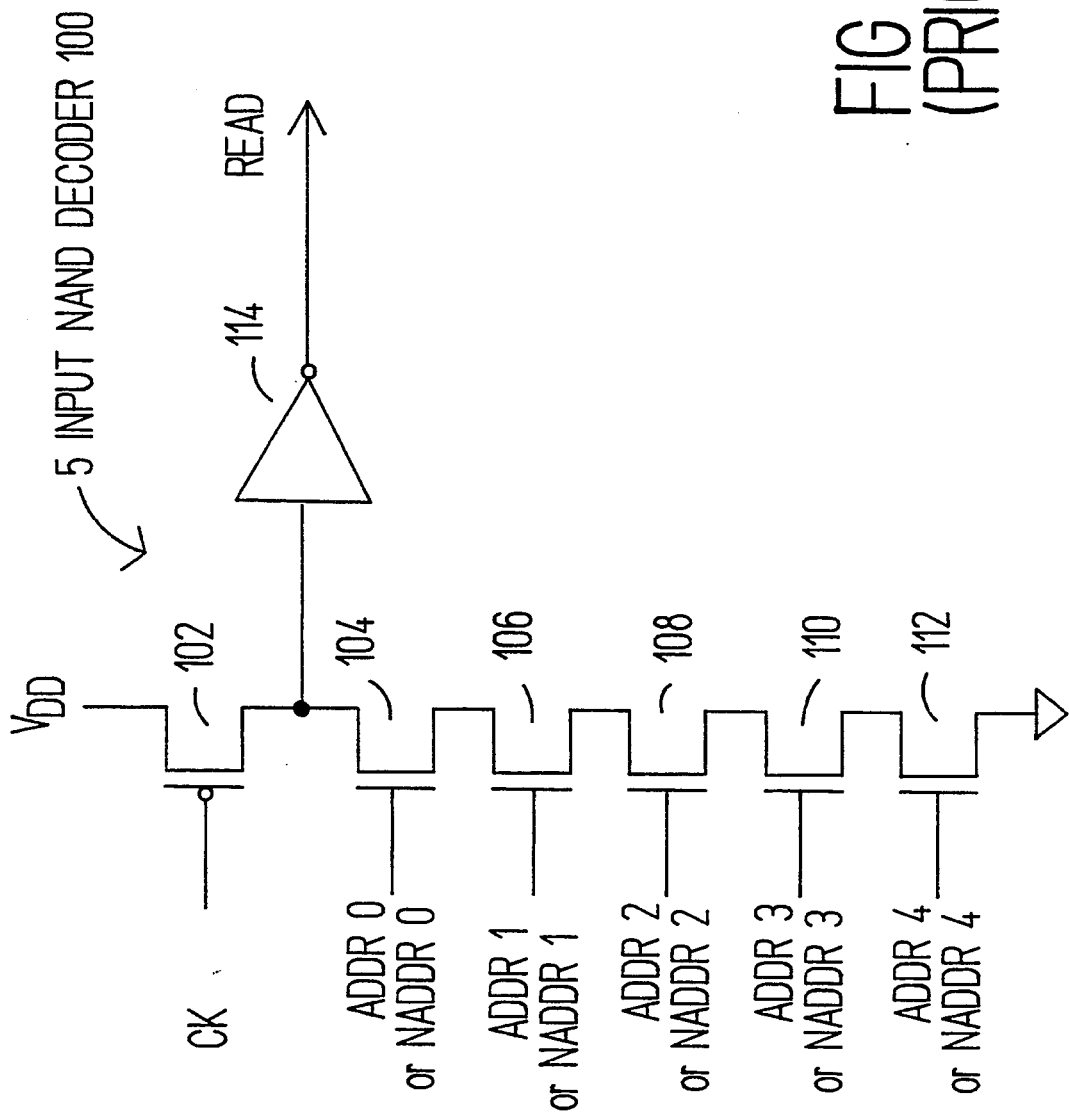
FIG. 1 illustrates a prior art five input NAND decoder having five NFETs in its pull-down string, 1 NFET for each address bit.
Figure 2:
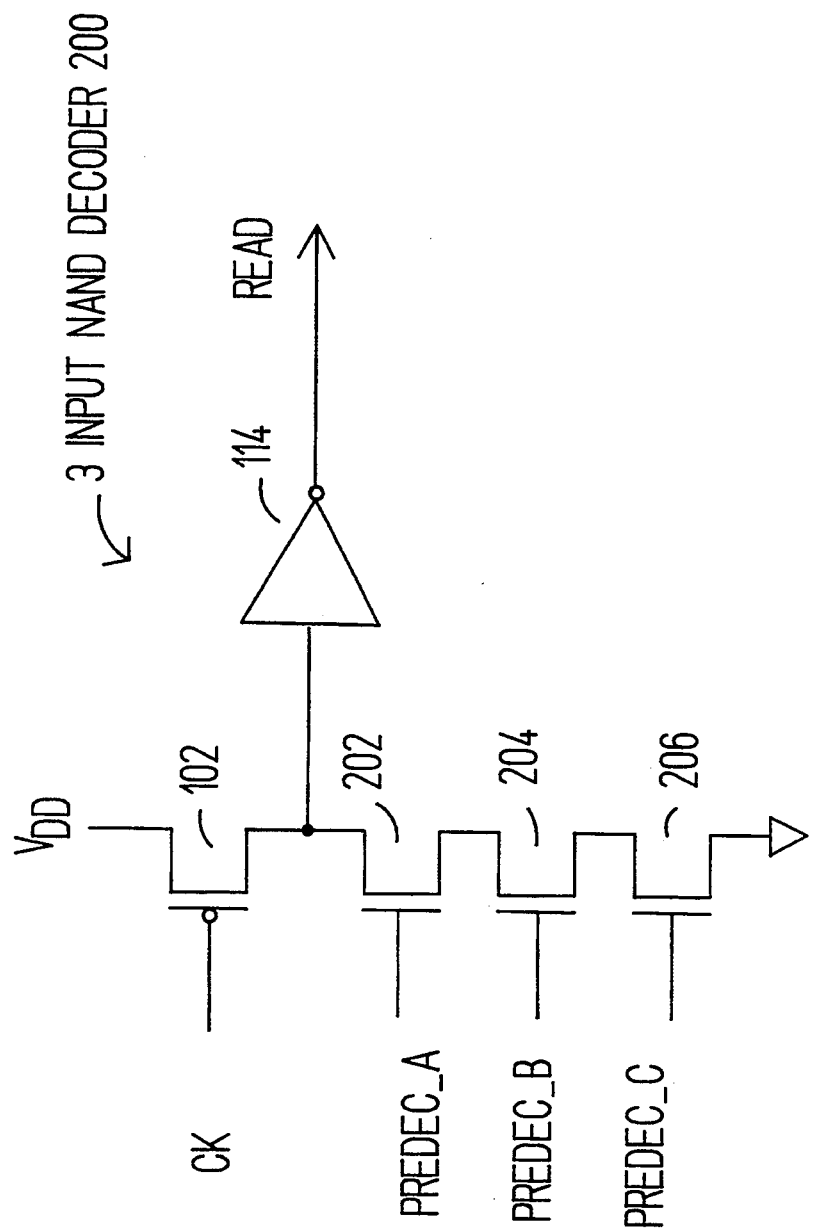
FIG. 2 illustrates a corresponding three input NAND decoder in accordance with the invention which requires only three NFETs in its pull-down string.

FIG. 2 illustrates a three input NAND domino-style decoder 200 in accordance with the invention designed for use in place of the five input NAND domino-style decoder 100 illustrated in FIG. 1 for addressing 1 of 32 registers in a register file. Of course, the technique of the invention can be expanded to cover n pairs of true/complement address inputs which are predecoded into 2n memory select lines in accordance with the techniques of the invention. As will be appreciated from the following, only three NFETs 202–206 are required in the NAND pull-down string for the five true/complement address inputs required to address 32 memory registers. As illustrated in FIG. 2, each NFET is responsive to respective groups of predecoded inputs PREDEC_A, PREDEC_B and PREDEC_C. These predecoded inputs will be described in more detail below with respect to FIGS. 4 and 5.

Figure 3:
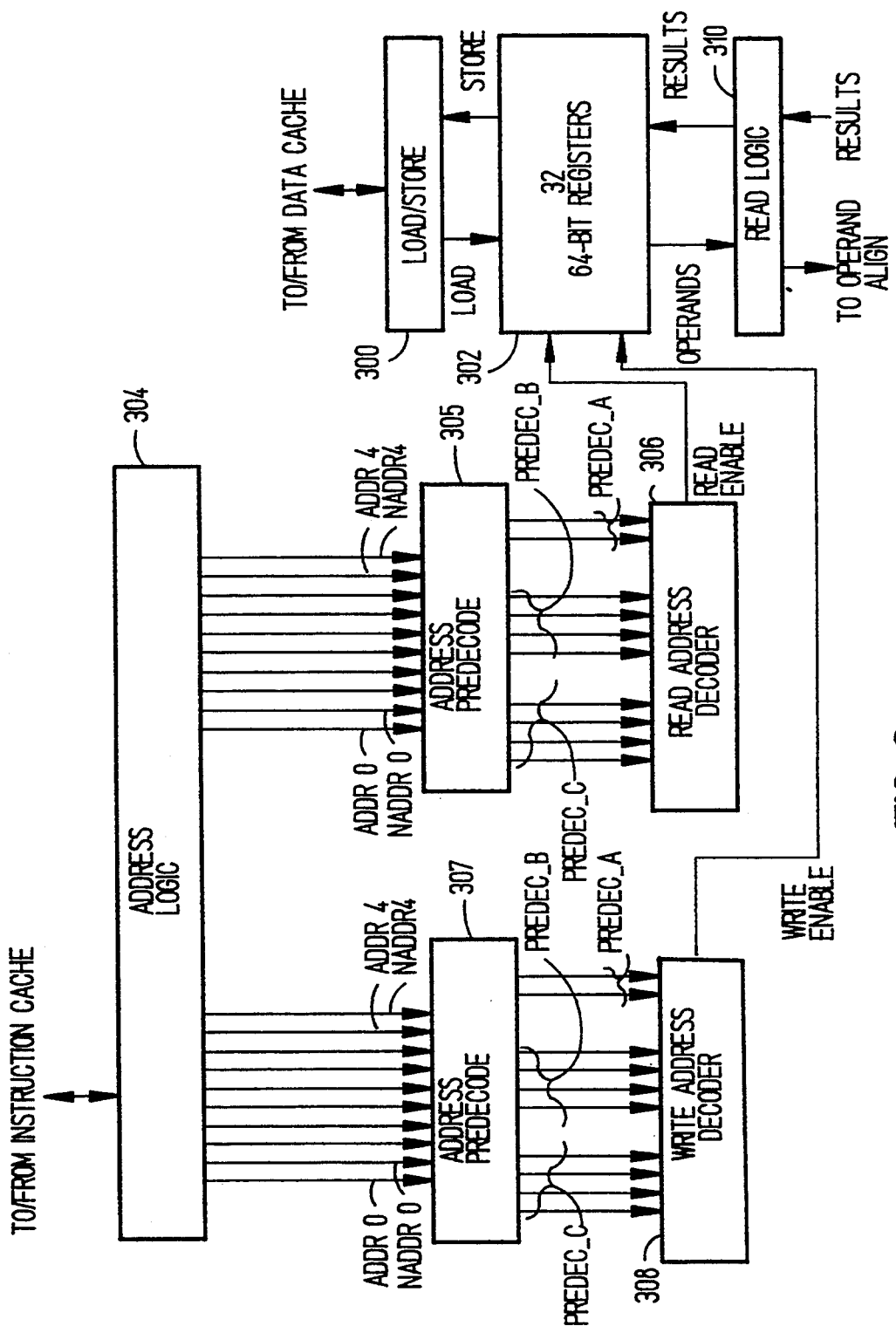
FIG. 3 illustrates a preferred embodiment of a register file implementing the address predecoder of the invention.

FIG. 3 illustrates a sample embodiment of a register file modified to embody the present invention. As illustrated, the register file preferably comprises load/store logic 300 which loads data into respective 64-bit registers of memory cell 302 and includes sensing amplifiers which detect output values from these 64-bit registers which are to be stored into a data cache of, for example, a floating point processor. Memory cell 302 may comprise a static RAM (SRAM) or some other memory device well known to those skilled in the art and may use 64-bit registers for double precision operations or 32-bit registers for single precision operations. Address logic 304 receives the address for the data from an instruction cache of the floating point processor and provides 10 true/complement address lines ADDR0–ADDR4 and NADDR0–NADDR4 to address predecoders 305 and 307 in accordance with the invention. As will be described in more detail below with respect to FIG. 4, address predecoders 305 and 307 predecode the 10 true/complement address inputs into 3 groups of predecoded address inputs which are provided to corresponding address decoders in read address decoder 306 and write address decoder 308. In the illustrated embodiment, read address decoder 306 and write address decoder 308 each include 32 decoders of the type illustrated in FIG. 2, one for each register of the register file. Hence, the read or write address is provided to a particular register of memory cell 302 when the appropriate address decoder of read address decoder 306 outputs a read enable signal or the appropriate address decoder of write address decoder 308 outputs a write enable signal.

Operands and the like stored in the 64-bit registers of memory cell 302 may be read out by read logic 310 which may include, for example, sensing amplifiers which detect output values from the memory cell 302 which are to be passed to the downstream logic. Results of the downstream logic operations performed by floating point processing units and the like may also be passed back through the read logic 310 for being written into the 64-bit registers of memory cell 302 in accordance with the techniques of the invention. Those skilled in the art will readily appreciate that the memory cell 302 may also include registers for storing floating point exception data and the like as described in the aforementioned Mason et al. patent application.

The invention as illustrated in FIG. 3 is characterized in that a .level of predecode (i.e., address predecoders 305 and 307) is added between the address drivers in the address logic 304 and the address decoders 306 and 308. As noted above, each address decoder in the address decoder blocks 306 and 308 is connected only to predetermined outputs from the output predecoders 305 and 307 such that no more input lines are necessary to implement the predecoding function than would be necessary without the predecoding function. In other words, the respective decode blocks only receive the predecode values for the address to the register cell represented by that address decoder. This aspect of the invention will be better understood after consideration of FIGS. 4 and 5.

Prior to the present invention, the use of predecode has been problematic since the number of wires running down the decoder stack is an area limiter in prior art decoders. For example, a 2–4 decoder has 2 inputs and 4 outputs. However, in accordance with the present invention, since the true/complement address lines are already bussed into the decoder stacks in the embodiment illustrated in FIG. 1, for example, there are already 4 address inputs (2 true/complement pairs) which can be decoded into 4 memory select outputs. Thus, no additional metal busses are required in the decoder stacks after going through a level of predecode. Also, since the address inputs to the predecode make no more than 1 transition (from low to high) when domino style logic is used, there are no logical inversions in the predecode logic, thereby making the output of the decoder of the invention glitch-free.

For a 32 register memory implementation as illustrated in FIG. 3, two sets of 4-to-4 predecoders are used in accordance with the invention. The fifth true/complement address pair is not predecoded. In other words, every n pairs of true/complement address inputs are decoded into 2n memory select lines which are provided only to the address decoders corresponding to the memory registers unique to the 2n memory address locations. Implementation of this aspect of the invention for the case of n=5 will now be described with respect to FIGS. 4 and 5.

FIG. 4 illustrates the 32 register cells (REG-0–REG32) of the memory register 302. As known to those skilled in the art, to provide a unique address to 32 registers, five address bits ($2^5=32$), and hence n=5 true/complement address pairs, are required to uniquely address each respective register of a 5 input read port when domino-style logic is used. Hence, as illustrated on the left hand side of FIG. 4, respective registers REG0–REG31 are addressed by the five respective address bits ADDR0–ADDR4 where ADDR0 represents the most significant bit of the address. In accordance with the invention, address bits ADDR0 and ADDR1 are predecoded into a predecode value PREDEC_C, while address bits ADDR2 and ADDR3 are predecoded into predecode value PREDEC_B. Since an odd number of true/complement address pairs is used (n=5), ADDR4 may be used directly as the predecode value PREDEC_A.

As illustrated in the following Table 1, the predecode values 0–3 for PREDEC_C and PREDEC_B correspond to the logical ANDs of the corresponding 2 pairs of true/complement addresses. For example, as illustrated in Table 1, PREDEC0 corresponds to the logical AND of NADDR0 and NADDR1, PREDEC1 corresponds to the logical AND of NADDR0 and ADDR1, PREDEC2 corresponds to the logical AND of ADDR0 and NADDR1, and PREDEC3 corresponds to the logical AND of ADDR0 and ADDR1. Hence, each predecode value corresponds to a unique combination of the values of the two pairs of true/complement addresses.

TABLE 1

| ADDR0 | NADDR0 | ADDR1 | NADDR1 | PREDEC0 | PREDEC1 | PREDEC2 | PREDEC3 |
|---|---|---|---|---|---|---|---|
| 0 | 1 | 0 | 1 | 1 | 0 | 0 | 0 |
| 0 | 1 | 1 | 0 | 0 | 1 | 0 | 0 |
| 1 | 0 | 0 | 1 | 0 | 0 | 1 | 0 |
| 1 | 0 | 1 | 0 | 0 | 0 | 0 | 1 |

In accordance with this predecoding technique, the right hand side of Table 4 indicates the predecode values corresponding to the respective pairs of addresses by placing a "1" in the column for PREDEC_C and PREDEC_B which corresponds to the respective pairs of true/complement addresses for the corresponding address. Hence, as illustrated, the value for PREDEC_C can be used to select 1 of 4 separate banks of 8 memory registers, while PREDEC_B can similarly be used to address banks of memory registers which have address bits ADDR2 and ADDR3 which are the same. The value for PREDEC_A can similarly be used to address even or odd registers.

In accordance with the invention, the number of inputs to the decoders are maintained at a minimum by connecting the respective decoders only to those predecode inputs which may be used to address that decoder. For example, NFET 206 of the decoder 200 corresponding to register 15 will be connected to the line for PREDEC2 for the PREDEC_C input, while NFET 204 of the decoder 200 will be connected to the line for PREDEC3 for the PREDEC_B input. This technique can be used to minimize the number of lead lines into the decoders. As will be apparent to one of ordinary skill in the art upon review of FIG. 2, the pull-down string will only cause the output of the domino gate to be driven high and hence provide a read or a write signal when all of the predecode values connected at that particular terminal to that particular decoder are true.

Figure 5:
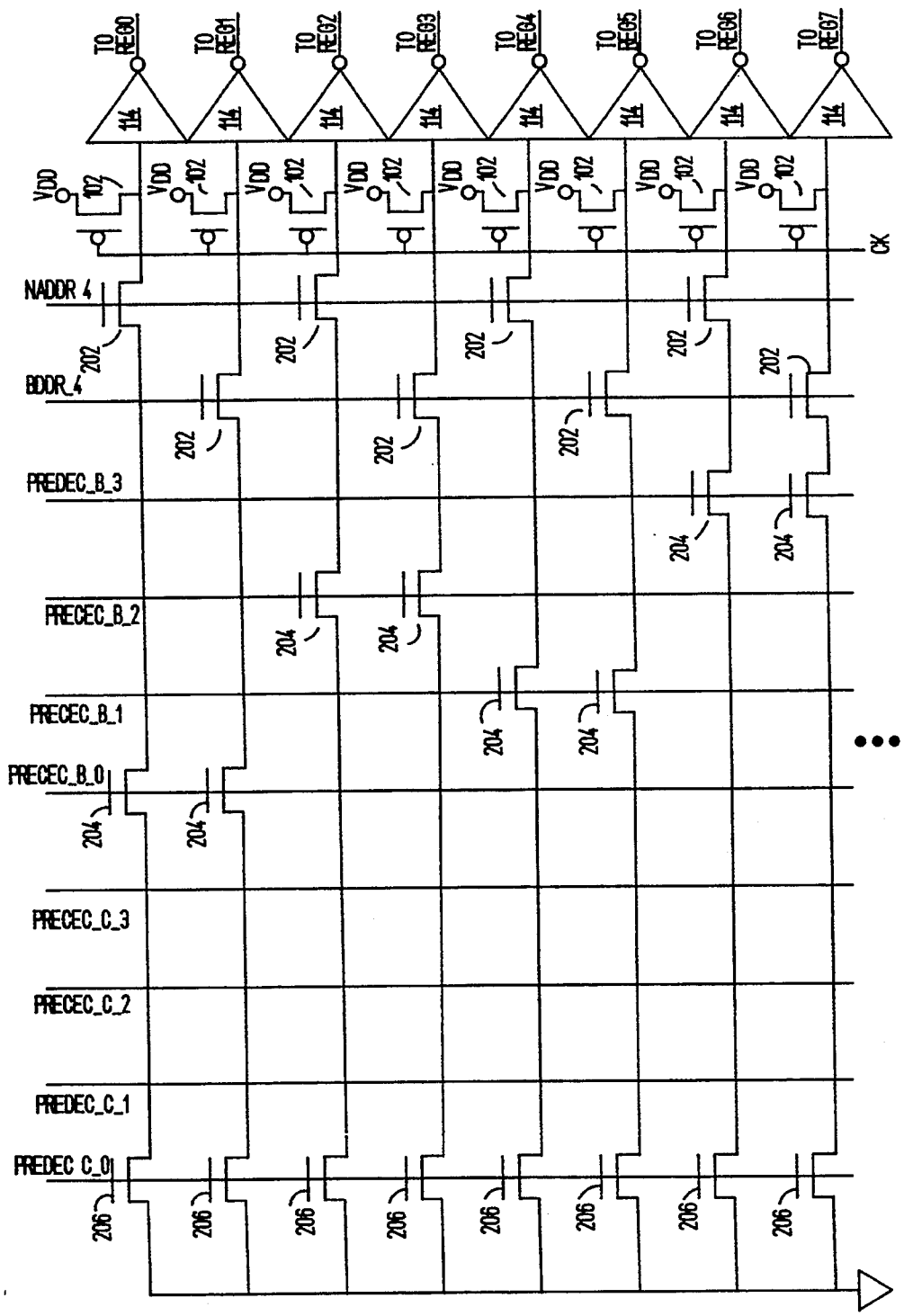
FIG. 5 illustrates a circuit implementation of the first eight registers (REG0-REG7) predecoded in accordance with the predecoding illustrated in FIG. 4.

FIG. 5 illustrates a particular implementation of decoder 200 in accordance with the invention. As illustrated, address predecoder 307 or 308 provides the respective predecode values, PREDEC_A, PREDEC_B, PREDEC_C, to the respective gates 202, 204, 206, respectively, for each decoder. As illustrated, each decoder has its own unique combination of inputs for its corresponding register but only requires 3 pull-down FETs 202, 204, 206. As will be appreciated by those skilled in the art, the technique of the invention reduces the number of pull-down FETs to n/2 for 2n memory select lines when n is even and to (n+1)/2 for 2n memory select lines when n is odd. Although only the connections for REG0-REG7 are illustrated in FIG. 5, those skilled in the art will appreciate that the remainder of the connections can be readily determined from FIG. 4 (the pattern for the first eight PREDEC_B inputs will repeat, while the PREDEC_C input will change every eight registers).

Hence, in accordance with the invention, instead of five transistors in the pull-down string of the decoder 200 for addressing 32 registers, there are now only three. Also, there are still only 10 wires running through the decoder stack as in the prior art system where five true/complement address pairs are used. However, in accordance with the invention, there are now 8 predecoded memory selects plus 1 pair of true/complement address pairs in place of the five true/complement address pairs. Of course, the same implementation can be used for larger registers whereby n true/complement address pairs would be encoded into to 2n memory bank selects in accordance with the techniques of the invention. Read address decoder 306 or write address decoder 308 would then decode the inputted predecode values in accordance with the connections to each of the respective decoders of the registers.

By using only three pull-down NFETs in the pull-down string instead of five as in the prior art decoder, the present invention results in an area advantage. Not only is the number of transistors smaller, but also each transistor can be made smaller and still have the same effective width/length as before. Moreover, because the transistors in the pull-down string are smaller than before, the capacitive load on the decoder inputs is reduced as well so as to provide a speed advantage. In addition, the predecoded memory selects are input to only 8 decoders instead of the 16 that the non-predecoded address inputs in accordance with the prior art were fed into. This reduced load helps compensate for the additional logic delay required for the predecoder. Also, because there are only three transistors in the pull-down string instead of five as in prior art FIG. 1 (for n=5), charge sharing is less of a problem.

Although an exemplary embodiment of the invention has been described in detail above, those skilled in the art will appreciate that many additional modifications are possible in the exemplary embodiment without materially departing from the novel teachings and advantages of the invention. For example, the present invention may be implemented in different types of address decoders, although the present invention is primarily beneficial for use with address decoders which receive true/complement address pairs as inputs. Of course, the techniques of the invention may also be readily extended to predecoding much larger addresses by extending the concepts described above with respect to FIGS. 4 and 5. Accordingly, all such modifications are intended to be included within the scope of this invention as defined in the following claims.

What is claimed is:

1. An address decoder for providing a signal for accessing a particular memory register of a memory device having a plurality of memory registers, comprising:
    means for providing an address of said particular memory register across a number of address lines in accordance with the number of memory registers of said memory device;
    a plurality of address decoders for selecting said particular memory register of said memory device by providing said signal to said particular memory register; and
    a predecoder responsive to said number of address lines for decoding every n pairs of address lines into 2n memory select lines which are provided only to the address decoders corresponding to the memory registers unique to said n pairs of address lines.

2. The address decoder of claim 1, wherein said address is provided to said predecoder from said providing means as respective true/complement address pairs.

3. The address decoder of claim 2, wherein said predecoder comprises a 4-to-4 decoder for every two pairs of true/complement addresses provided by said providing means across said address lines, each 4-to-4 decoder outputting a memory select signal which corresponds to a logical AND of the true/complement address lines unique to the particular memory register specified by said address.

4. The address decoder of claim 3, wherein each of said address decoders comprises $n/2$ pull-down FETs responsive to $2n$ memory select lines, where n is even, or $(n+1)/2$ pull-down FETs responsive to $2n$ memory select lines, where n is odd, said pull-down FETs being connected in series such that said signal is provided to the particular memory register specified by said address only when each of said memory select lines is true for an address decoder corresponding to said address.

* * * * *